Aug. 7, 1956 W. S. WINFIELD 2,758,212

HIGH-FREQUENCY TUNING APPARATUS

Filed Nov. 26, 1952 2 Sheets-Sheet 1

Inventor:
William S. Winfield.
by Merton D. Moore
His Attorney.

Inventor:
William S. Winfield,
by Merton D. Morse
His Attorney.

United States Patent Office 2,758,212

Patented Aug. 7, 1956

2,758,212

HIGH-FREQUENCY TUNING APPARATUS

William S. Winfield, Manlius Township, Onondaga County, N. Y., assignor to General Electric Company, a corporation of New York Application November 26, 1952, Serial No. 322,777

7 Claims. (Cl. 250—40)

The present invention relates to high-frequency tuning apparatus, and, more particularly, to improved wide-range band-selection tuners for the very-high-frequency and the ultra-high-frequency tuning ranges. It has particular utility as applied to the high-frequency circuits of television receiving apparatus and the like.

In present-day commercial television systems, the sound and picture signal waves are transmitted over certain frequency channels that are allotted positions extending over a large part of the frequency spectrum, including both the very-high-frequency region and the ultra-high-frequency region, viz, from about 54 megacycles to about 890 megacycles. Due to the present-day frequency channel allocations to other services, e. g., F. M. radio, governmental and military services, etc., there are also large gaps in the frequency spectrum between certain of the channels. These gaps divide the television frequency spectrum into groups of frequencies and, as is readily apparent, they cause a further extension of the range which includes the highest frequency television channel and the lowest frequency television channel. Consequently, it is desirable to have a tuning apparatus that is suitable for tuning a wide range of frequencies including spaced groups of frequency channels.

It is an object of the present invention to provide an improved tuning apparatus that is capable of being tuned to a wide range of frequency bands including both the very-high-frequency and the ultra-high-frequency ranges such as those employed in television broadcasting.

It is another object of the present invention to provide a compact, combination very-high-frequency and ultra-high-frequency band-selection tuning apparatus that is tunable over its entire range by means of a single control.

Briefly stated, the invention comprises a unitary tuning structure having a selector switch whose fixed and movable elements are employed in cooperation with lumped and distributed impedance elements to provide a variety of tuning elements suitable for tuning over a wide-range of frequencies. A preferred form of the invention features a multi-contact selector switch comprising a plurality of pairs of fixed contact elements including a pair of terminal contact elements. The switch also comprises a plurality of pairs of jointly movable conductive elements being arranged selectively to contact said pair of terminal contact elements and, at the same time, selectively to contact selected pairs of the other fixed elements. Coil-type inductance units are individually connected across certain of the fixed element pairs. Transmission line-type inductance units are individually connected across certain of the other fixed element pairs and transmission line type inductance units are also individually connected across certain of the movable pairs. By selectively positioning selected pairs of the movable elements, the fixed terminal contact elements may be connected through a selected pair of the movable contact elements to various other fixed contact elements bearing either coil type or transmission line type inductance units. By further selective positioning of certain of the pairs of movable contact elements bearing transmission line-type inductances, they may be connected across the fixed terminal contact elements and by still further positioning of the movable elements, the fixed terminal contact elements may be left free of contact with movable elements, thus providing an open-ended type transmission line type inductance comprising the fixed contact elements.

For additional objects and advantages, and for a better understanding of the invention, attention is now directed to the following description and accompanying drawing. The features of the invention which are believed to be novel are particularly pointed out in the appended claims.

Figure 1:
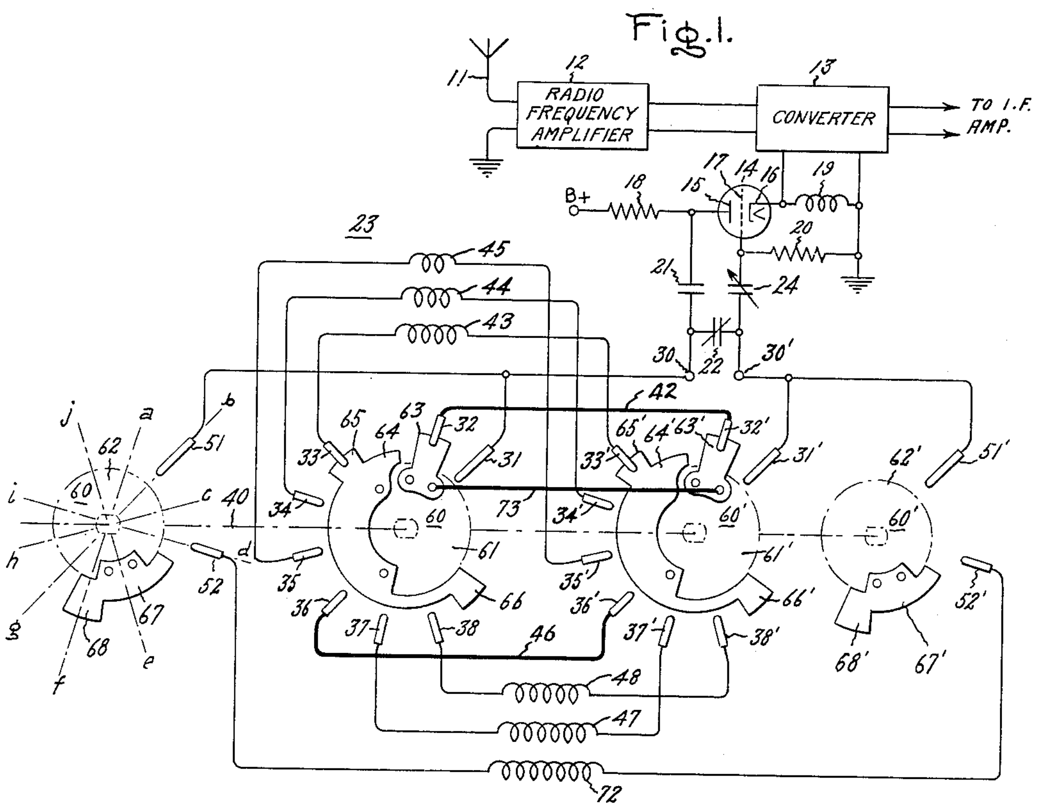
Fig. 1 is a schematic representation, partly in block form, of a portion of a television receiving apparatus including an oscillator circuit incorporating a tuning structure constructed in accordance with the present invention and showing the selector switch situated at a particular tuning setting.

Referring now to Fig. 1, there is shown the high-frequency input portion, known generally as the "head end," of a conventional television receiving apparatus. An antenna system 11, adapted to intercept television signal waves including both the very-high-frequency and the ultra-high-frequency regions of signal transmission, is connected to a radio-frequency amplifier 12 which may include on or more stages of amplification of a conventional variety. The radio-frequency amplifier 12 is coupled in the usual manner to the converter 13 whose function, as is well-known in the art, is to combine the incoming signal-modulated carrier wave with a locally-generated oscillation to produce an intermediate-frequency wave of lower frequency than the incoming carrier wave. The locally-generated oscillations required by the first detector 13 are supplied by a local oscillator comprising the electron discharge device 14 and associated circuit elements. Device 14 comprises an anode 15, a cathode 16 and a control grid 17. The anode 15 is connected through a dropping resistor 18 to the positive side of a suitable source of operating potential (not shown) which has its negative side grounded in the usual manner. The cathode 16 is connected through a radio-frequency choke coil 19 to ground. Grid 17 is connected through a grid resistor 20 to ground. The anode 15 is connected through a decoupling capacitor 21 to one end of the oscillator tuned circuit which includes a variable capacitor 22 in parallel with a selected inductance unit of a tuning apparatus, shown generally at 23, having a pair of terminals 30, 30′ for connection thereto. The grid 17 is connected through a trimmer capacitor 24 to the end of the oscillator tuned circuit remote from the anode 15. The tuning apparatus 23 is a band-switching apparatus constructed in accordance with the present invention.

Ordinarily, a band selection apparatus (not shown) similar to the apparatus 23 shown connected to the oscillator 14, is also provided for tuning the radio-frequency amplifier 12 in which case the two band selection devices are usually "ganged" for simultaneous operation in a well-known manner. However, for the sake of simplicity, only the oscillator band selection apparatus 23 has been illustrated.

In accordance with conventional practice, the frequency range of the oscillator is determined by the value of a tuned circuit element and, more particularly, by suitable adjustment of the tuning apparatus 23, whereby a specific inductance unit of desired value may be connected in the oscillator tuned circuit in parallel with the tuning capacitor 22, in which case the latter element may be utilized further to tune the output frequency of the oscillator within the parameters set up by the selected inductance unit connected in circuit at any given instant. The oscillator output is derived across the cathode choke coil 19 and supplied to the converter 13 in conventional manner.

In the illustrated embodiment of Fig. 1, the tuning apparatus 23 comprises ten positions, designated *a—j* in the clockwise direction of a twelve position selector switch. The selector switch has four jointly rotatable groups of contact elements comprising a plurality of inner and outer pairs of contact elements, with both elements of each pair bearing identical reference numerals, the right-hand element of each pair bearing a primed numeral. Four groups of stator elements are disposed in spaced and insulated relation with respect to one another in four axially aligned arcs about a common shaft 40, represented by a broken line in Fig. 1. The two inner groups of stator elements are arranged to provide eight matched pairs of stator elements 31, 31′—38, 38′ and the outer two groups are further arranged to provide two matched pairs of stator elements 51, 51′ and 52, 52′. The inner pair of stator elements 31, 31′ and the outer pair of stator elements 51, 51′ are terminal contact pairs. They are of greater axial length and extend closer to the shaft 40 than the other stator elements 32, 32′—38, 38′ and 52, 52′. The four terminal contact elements 31, 31′ and 51, 51′ are connected to the corresponding ones of the pair of terminals 30, 30′ for connection to the remainder of the oscillator circuit, as previously described.

Two jointly rotatable rotors 60 and 60′ formed of an electrically insulating material, are keyed to the shaft 40 in axial alignment therewith. The inner surfaces 61, 61′ and the outer surfaces 62, 62′ of rotors 60, 60′ are electrically isolated from one another. The rotors 60 and 60′ carry on their respective inner surfaces 61, 61′ two pairs of arcuate rotor contact elements 63, 64 and 63′, 64′ respectively. The radial length of rotor contacts 63, 63′ is such that they extend beyond the inner tips of each and every stator contact element in order to make selective wiping contact therewith. Two diametrically opposite portions 65, 65′ and 66, 66′ of the contact elements 64, 64′ are raised to the same radial length as that of elements 63, 63′ in order to make selective wiping contact with each stator element. However, the remaining body portion of contact elements 64, 64′ has a reduced radial length such that it fails to contact the stator elements 33—38 and 33′—38′ but does contact the terminal contact elements 31, 31′ in certain switch positions due to the extra length of the last-mentioned elements which, as mentioned above, causes them to extend closer to the shaft 40 than the other stator elements.

The outer sides 62, 62′ of the rotors 60, 60′ carry arcuate contacts 67, 67′ respectively, having raised portions 68, 68′ whose radial length is such that contact is made selectively with the stator elements 51, 52 and 51′, 52′ respectively. The remaining portion of rotor contacts 67, 67′ is reduced in radial length, in similar manner to elements 64, 64′, so that contact is made in certain switch positions with the terminal stator elements 51, 51′ only.

The inner stator contact elements 32, 32′ are connected by a conductor 42 comprising a transmission-line type inductance unit. The pair of stator contacts 33, 33′ is bridged by a coil-type inductance unit 43. Another coil-type inductance unit 44 interconnects the stator pair 34, 34′. Still another coil-type inductance unit 45 interconnects the stator elements 35, 35′. Another inductance of the transmission-line type 46 joins the stator pair 36, 36′. The stator pair 37, 37′ is bridged by an inductance 47 of the coil-type. Another coil-type inductance unit 48 bridges the stator element pair 38, 38′. The outer pair of stator terminals 52, 52′ is bridged by a coil-type inductance 72. The inner pair of rotor contact elements 63, 63′ is bridged by a transmission-line type inductance 73.

The inductance appearing across the terminals 30, 30′ may be adjusted by rotating the shaft 40 in a convenient manner as by a uni-control tuning knob (not shown). By rotating the shaft 40, the stator terminal contact elements 31, 31′ and 51, 51′ may be left in the open position, as shown in Fig. 1, or they may be brought in contact with a selected pair of the rotor contact elements. A conventional detent mechanism may be employed to lock the shaft 40 in any given contact position. Since such a detent mechanism, per se, forms no part of the present invention, it has not been illustrated.

Figures 4, 5, 6:
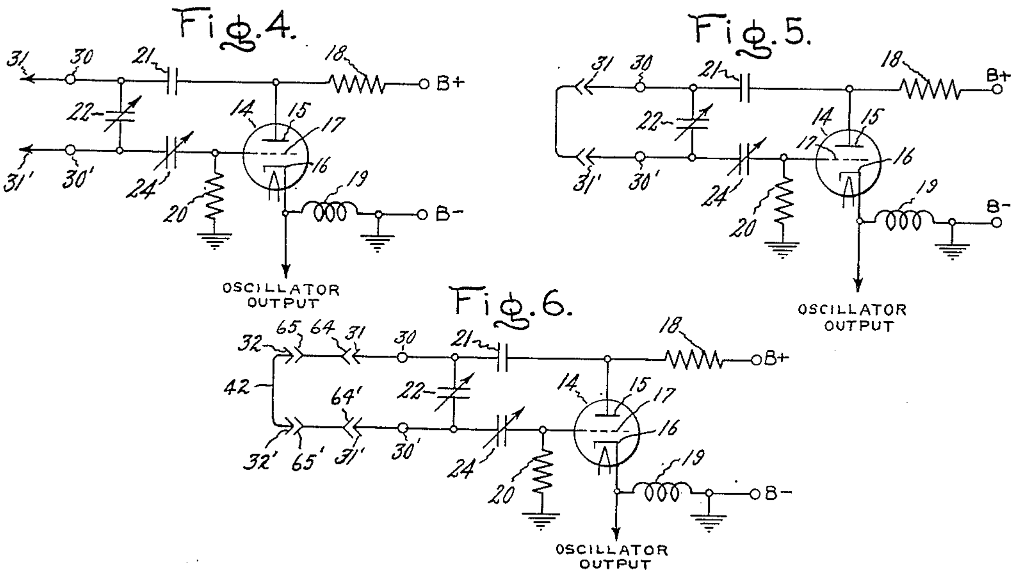
Fig. 4 is a schematic diagram of an oscillator circuit including a simplified schematic presentation of the tuning structure shown in Fig. 1, showing the selector switch situated at the same tuning setting as in Fig. 1.
Fig. 5 is a schematic diagram of an oscillator circuit including a simplified schematic presentation of the tuning structure shown in Fig. 1, showing the selector switch situated at the same tuning setting as in Fig. 2.
Fig. 6 is a schematic diagram of an oscillator circuit including a simplified schematic presentation of the tuning structure shown in Fig. 1, showing the selector switch situated at the same tuning setting as in Fig. 3.

In the rotor position shown in Fig. 1, the stator terminal contacts 31, 31′ and 51, 51′ are in the open position, i. e., there is no closed wire circuit connecting these terminals. In this position, the tuning apparatus 23 functions as an open-ended transmission line-type inductance. A simplified schematic representation of this arrangement is shown in Fig. 4, wherein it is seen that the inductance provided at the terminals 30, 30′ comprises stator contacts 31, 51 and connecting leads in one side of the line and matching contacts 31′, 51′ and connecting leads in the other side of the line.

Figure 2:
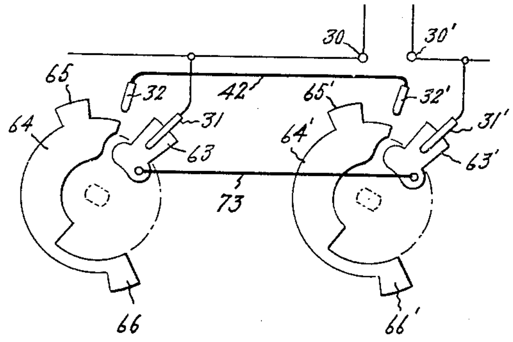
Fig. 2 is a schematic diagram of a portion of the tuning structure shown in Fig. 1, showing the selector switch situated at another tuning setting.

By clockwise rotation of the shaft 40 to position *b*, the rotor contact elements 63, 63′ may be brought in contact with the terminal stator contact elements 31, 31′, as illustrated in Fig. 2. In this contact position, the tuning apparatus 23 functions as a transmission line-type inductance unit of the closed-end type. As shown in the simplified schematic circuit of Fig. 5, the inductance element in this switch position comprises a pair of stator contacts 31, 31′, a pair of rotor contacts 63, 63′, and a shorting connection 73.

Figure 3:
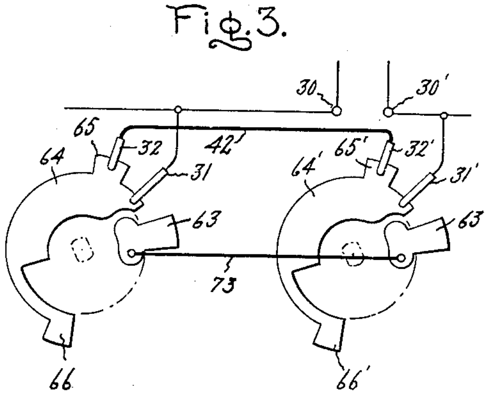
Fig. 3 is a schematic diagram of the portion of the tuning structure shown in Fig. 2, showing the selector switch situated at still another tuning setting.

By further rotation of the shaft 40 in the clockwise direction to position *c*, the rotor contacts 63, 63′ may be removed from contact with the terminal stator contact elements 31, 31′ and replaced with the body portion of the rotor contact elements 64, 64′ and simultaneously therewith, the stator contact elements 32, 32′ may be brought in contact with the raised portions 65, 65′ of contact elements 64, 64′, as illustrated in Fig. 3. Due to the presence of the shorting connection 42 across the stator contact elements 32, 32′ a transmission line-type inductance unit is provided by this switch position. As illustrated more clearly in Fig. 6, the transmission-line inductance thus provided includes a pair of stator elements 31, 31′ connected to a pair of rotor contact components 64, 64′ which are connected in turn to a shorting element 42.

By continued rotation of the shaft 40 in the clockwise direction to position *d*, the terminal stator elements 31, 31′ may be kept in contact with the rotor contact elements 64, 64′ and in addition thereto, the stator contact elements 36, 36' may be brought into contact with the raised portions 66, 66' of rotor contacts 64, 64'. This position of the selector switch connects the shorting connection 46, bridging elements 36, 36', in the tuning apparatus circuit to provide still another transmisison line type inductance unit.

By additional clockwise rotation of the shaft 40 to position *e*, terminal contact elements 31, 31' may be retained in contact with the rotor contacts 64, 64' and simultaneously the stator contacts 35, 35' bearing coil type inductance 45 may be brought in contact with the raised portion 66, 66' of rotor contacts 64, 64'. Thus, tuning structure 23 is provided with a coil type inductance 45.

By still further clockwise rotation of the shaft 40 to position *f*, the rotor element portions 66, 66' may be brought in contact with the stator contacts 34, 34' while the terminal contacts 31, 31' continue in contact with rotor contact elements 64, 64'. This position provides another coil type inductance position for the tuning apparatus 23.

By rotating the shaft 40 in a clockwise direction still further to position *g*, stator contact elements 33, 33', bridged by a coil type inductance 43, may be brought in contact with the raised rotor contact portions 66, 66', while the terminal contacts 31, 31' remain in contact with the rotor contact elements 64, 64'. Thus, a further coil-type inductance is provided for the tuning structure 23.

By further clockwise rotation of the shaft 40 to position *h*, with terminal contacts 31, 31' remaining in contact with the rotor contact elements 64, 64', the stator contact elements 38, 38' may be brought in contact with the raised rotor contact portions 65, 65', thus connecting the coil-type inductance unit 48 in circuit across the terminals 30, 30'.

A still further clockwise rotation of the shaft 40 to position *i* moves the raised rotor contact portions 65, 65' from the stator contact elements 38, 38' to the stator elements 37, 37'. Since terminal contacts 31, 31' remain in contact with the rotor contacts 64, 64', the coil type inductance 47 is thus connected in the tuning circuit of the apparatus 23.

By further clockwise rotation of the shaft 40 to position *j*, the raised portions 65, 65' of the rotor contacts 64, 64' are removed from contact wtih the stator contacts 37, 37' to an open switch position. Simultaneously therewith, the outer rotor contact elements 67, 67' are brought in contact with their respective terminal stator elements 51, 51' and with their respective stator contact elements 52, 52' at its raised portions 68, 68'. In this position, the coil-type inductance 72, which is connected across the stator contacts 52, 52', is connected in circuit across terminals 30, 30'.

Figure 7:
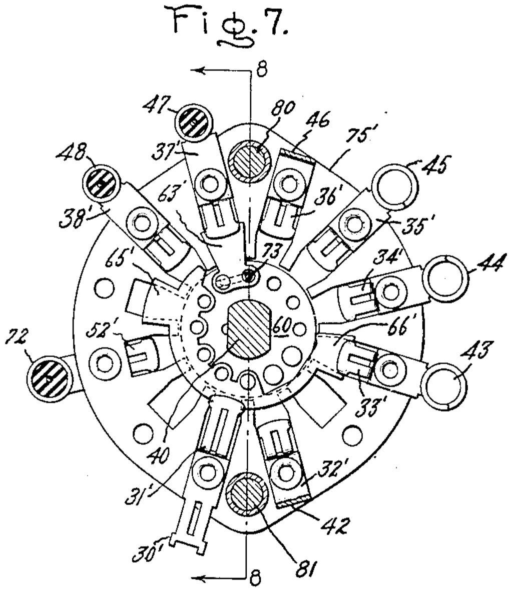
Fig. 7 is a cross-sectional view, perpendicular to the axis, of a tuning structure embodying the present invention.
Figure 8:
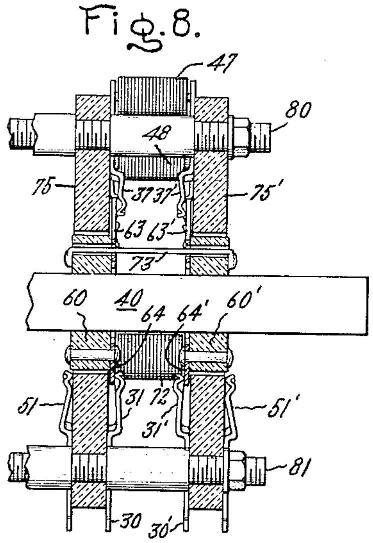
Fig. 8 is a longitudinal cross-sectional view of the tuning structure shown in Fig. 7, taken along the lines 8—8 of Fig. 7.

In Figure 7 there is shown a cross-sectional view of a switching structure for carrying out the present invention. Corresponding reference numerals have been given to the elements corresponding to those of Figures 1, 2 and 3. The particular structure illustrated is a development of a commercially-available wafer-type switch. A pair of stator portions 75 and 75' carry the stator elements, but Figure 7 shows only the left stator portion 75; portion 75' is shown in Figure 8. The shaft 40 carries the rotor 60, which in turn carries the inner rotor contact elements 63 and 64. The outer rotor contact element (67 as seen in Fig. 1) is not visible in Figure 7. The left stator portion 75 is mounted on a pair of rods 80 and 81 and it carries about its inner periphery the inner stator contact elements 31—38 and about its outer periphery the outer stator contact elements 51 and 52. The exposed face 61 of the rotor 60 corresponds to the inner face 61 of the rotor 60, as seen in Figure 1.

In Figure 8, there is shown a longitudinal cross-sectional view of the structure shown in Figure 7, in which the relationship of the left and right hand wafer switch portions along the shaft 40 are shown more clearly than in the preceding figure. Figure 8 shows the relationship of both stator portions 75 and 75' and rotor portions 60 and 60' more clearly than the preceding figures. It will also be apparent from an examination of Figure 8, that in the upper-frequency ranges the transmission-line or distribution impedance units, e. g., 73, may actually comprise direct-wire connections, as is well-known in the art.

While in the illustrated embodiment, the invention has been shown as comprising a pair of wafer switches, it is entirely conceivable that four separate wafer portions might be used to carry the four sets of contact elements. However, the use of two insulated wafer portions to carry the inner and outer contact elements provides a more simple and compact arrangement, as shown.

It is also considered apparent to those skilled in the art that within the scope of the present invention a tuning apparatus may be constructed embodying more or less than the ten operative switch positions shown and described above.

While a specific embodiment has been shown and described, it will of course be understood that various modifications may be made without departing from the principles of the invention. The appended claims are, therefore, intended to cover any such modifications within the true spirit and scope of the invention.

What I claim as new and desire to secure by Letters Patent of the United States is:

1. A unitary frequency band selection apparatus comprising a multi-contact switch having a plurality of pairs of fixed contact elements including a pair of terminal contact elements, a plurality of pairs of movable contact elements arranged successively to contact selected pairs of said fixed elements and simultaneously therewith to contact said pair of terminal contact elements, said movable contact elements being arranged selectively to be free of contact with said terminal contact elements to provide an open-ended transmission-line type inductance, transmission-line type inductance units individually connected across certain of said fixed pairs, coil-type inductance units individually connected across certain others of said fixed pairs, and transmission line-type inductance units individually connected across certain of said movable pairs.

2. A unitary frequency band selection apparatus comprising a multi-contact switch having a plurality of pairs of stator contact elements including a pair of terminal contact elements, a plurality of pairs of rotor contact elements arranged successively to contact selected pairs of said stator elements and simultaneously therewith to contact said pair of terminal contact elements, said rotor contact elements being arranged selectively to be free of contact with said terminal contact elements to provide an open-ended transmission-line type inductance, transmission-line type inductance units individually connected across certain of said stator pairs, coil-type inductance units individually connected across certain others of said stator pairs, and transmission-line type inductance units individually connected across certain of said rotor pairs.

3. A unitary frequency band selection apparatus comprising a multi-contact switch having a plurality of pairs of stator contact elements including a pair of terminal contact elements, a pair of jointly rotatable rotors having a plurality of pairs of rotor contact elements arranged successively to contact selected pairs of said stator elements and simultaneously therewith to contact said pair of terminal contact elements, said rotor contact elements being arranged selectively to be free of contact with said terminal contact elements to provide an open-ended transmission-line type inductance, transmission-line type inductance units individually connected across certain of said stator pairs, coil-type inductance units individually connected across certain others of said stator pairs, and transmission-line type inductance units individually connected across certain of said rotor pairs.

4. In a television receiving apparatus, a unitary high-frequency band selection apparatus comprising a multi-contact switch having a plurality of pairs of stator contact elements including a pair of terminal contact elements, a pair of jointly rotatable rotors having a plurality of pairs of arcuate rotor contact elements arranged successively to contact selected pairs of said stator elements and simultaneously therewith to contact said pair of terminal contact elements, said rotor contact elements being arranged selectively to be free of contact with said terminal contact elements to provide an open-ended transmission-line type inductance, transmission-line type inductance units individually connected across certain of said stator pairs, coil-type inductance units individually connected across certain others of said stator pairs, and transmission-line type inductance units individually connected across certain of said rotor pairs.

5. A unitary frequency band selection apparatus for the very-high-frequency and ultra-high-frequency range comprising a multi-contact switch having a plurality of pairs of inner and outer fixed stator contact elements including an inner and an outer pair of terminal contact elements, a pair of jointly rotatable rotors having a plurality of pairs of rotor contact elements including first and second pairs of inner rotor elements and a pair of outer rotor elements, said first inner rotor pair being arranged successively to contact selected pairs of said inner stator elements and simultaneously therewith to contact said inner pair of terminal contact elements, said second inner rotor pair being arranged selectively to contact said inner pair of terminal contact elements, said outer rotor pair being arranged successively to contact a selected pair of said outer stator elements and simultaneously therewith to contact said outer pair of terminal contact elements, said inner and outer rotor elements being arranged selectively, simultaneously to be free of contact with said inner and outer terminal contact elements respectively, one or more transmission-line type inductance units individually connected across certain of said inner stator pairs, a plurality of coil-type inductance units individually connected across certain others of said inner stator pairs, coil-type inductance units individually connected across certain of said outer stator pairs, and transmission-line type inductance units individually connected across said second inner rotor element pair.

6. A unitary frequency band selection apparatus comprising a multi-contact switch having a plurality of pairs of fixed contact elements including a pair of terminal contact elements, a plurality of pairs of movable contact elements arranged successively to contact selected pairs of said fixed elements and simultaneously therewith to contact said pair of terminal contact elements, said movable contact elements being arranged selectively to be free of contact with said terminal contact elements to provide an open-ended type distributive impedance circuit, distributive impedance circuits individually connected across certain of said fixed pairs, lumped impedance circuits individually connected across certain others of said fixed pairs, and distributive impedance circuits individually connected across certain of said movable pairs.

7. A unitary frequency band selection apparatus comprising a multi-contact switch having a plurality of pairs of stator contact elements including a pair of terminal contact elements, a pair of jointly rotatable rotors having a plurality of pairs of rotor contact elements arranged successively to contact selected pairs of said stator elements and simultaneously therewith to contact said pair of terminal contact elements, said rotor contact elements being arranged selectively to be free of contact with said terminal contact elements to provide an open-ended type distributive impedance circuit, distributive impedance circuits individually connected across certain of said stator pairs, lumped impedance circuits individually connected across certain others of said stator pairs, and distributive impedance circuits individually connected across certain of said rotor pairs.

References Cited in the file of this patent

UNITED STATES PATENTS

| | | |
|---|---|---|
| 2,309,014 | Root | Jan. 19, 1943 |
| 2,420,657 | Dodds et al. | May 20, 1947 |
| 2,445,786 | Libbey et al. | July 27, 1948 |
| 2,469,941 | Abrams | May 10, 1949 |
| 2,545,681 | Zepp et al. | Mar. 20, 1951 |